United States Patent
Kawahara et al.

(10) Patent No.: US 6,261,974 B1
(45) Date of Patent: Jul. 17, 2001

(54) GROWTH METHOD OF A POLYMER FILM

(75) Inventors: Jun Kawahara; Yoshihiro Hayashi; Akinori Nakano; Mikio Shimizu; Tomohisa Nishikawa, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/333,875

(22) Filed: Jun. 14, 1999

(30) Foreign Application Priority Data

Jun. 17, 1998 (JP) .................................................. 10-170016

(51) Int. Cl.[7] .................................................. H01L 21/469
(52) U.S. Cl. ............................ 438/781; 438/750; 438/794
(58) Field of Search .................................... 438/758, 780, 438/794, 907, 909; 427/248.1, 255.6

(56) References Cited

U.S. PATENT DOCUMENTS

| | | | | |
|---|---|---|---|---|
| 5,024,927 | * | 6/1991 | Yamada et al. | 430/495 |
| 5,196,376 | * | 3/1993 | Reche | 437/225 |
| 5,366,766 | * | 11/1994 | Sekiguchi et al. | 427/255.4 |
| 5,503,873 | * | 4/1996 | Gavalas et al. | 427/228 |
| 5,670,212 | * | 9/1997 | Staring et al. | 427/255.6 |
| 5,709,753 | * | 1/1998 | Olsen et al. | 118/719 |
| 5,804,259 | * | 9/1999 | Robles | 427/577 |
| 5,830,602 | * | 11/1998 | Barker et al. | 429/218 |
| 5,869,135 | * | 2/1999 | Vaeth et al. | 427/255 |
| 5,874,131 | * | 2/1999 | Vaartstra et al. | 427/250 |
| 5,952,046 | * | 9/1999 | Chayka | 427/249.1 |
| 5,958,510 | * | 10/1999 | Sivaramakrisnam et al. | 427/255.6 |
| 6,010,969 | * | 1/2000 | Vaartstra | 438/758 |
| 6,603,202 | * | 5/2000 | Cleary et al. | 118/728 |

FOREIGN PATENT DOCUMENTS

| | | | |
|---|---|---|---|
| 8-17749 | 1/1996 | (JP) | H01L/21/205 |
| 9-143739 | 6/1997 | (JP) | C23C/16/44 |
| 11-17006 | 1/1999 | (JP) | H01L/21/768 |
| WO95/18249 | 7/1995 | (WO) | C23C/16/50 |

OTHER PUBLICATIONS

Stanley Wolf and Richard N. Tauber, "Silicon Processing for the VLSI Era Volume 1: Process Technology", 1986, Lattice Press, pp. 171–714.*

Henry Dorin, Chemistry The Study of Matter, 1987, Allyn and Bacon, Inc., p. 120.*

"Real–Time FT–IR Studies of the Reaction Kinetics for the Polymerization of Divinyl Siloxane Bis–Benzocyclobutene Monomers" Stokich et al Materials Research Symposium Proceeding; vol. 227; 1991; pp 103–114.

* cited by examiner

*Primary Examiner*—Matthew Smith
*Assistant Examiner*—Renzo N. Rocchegiani
(74) *Attorney, Agent, or Firm*—Hayes, Soloway, Hennessey, Grossman & Hage, P.C.

(57) ABSTRACT

A DVS-BCB polymer film is grown by heating a divinyl siloxane bisbenzocyclobutene (DVS-BCB) monomer in a vaporization controller with continuously supplying; supplying a carrier gas and maintaining a partial pressure of the DVS-BCB monomer at a state lower than a saturated vapor pressure, thereby to vaporize the monomer; transporting the carrier gas containing the DVS-BCB monomer from the vaporization controller to an evacuated reaction chamber; and spraying the gas on the heated surface of a substrate in the reaction chamber.

14 Claims, 15 Drawing Sheets

GROWTH METHOD OF A POLYMER FILM

BACKGROUND OF THE INVENTION

1. Field of the Invention

The present invention relates to a growth method of a polymer film and, more particularly, to a method of producing a functional organic polymer film for insulating between multi-layer wirings of a semiconductor integrated circuit.

2. Description of the Prior Art

As semiconductor integrated circuits have been reduced in size deterioration of performance caused by wiring signal delay becomes a problem. Wiring signal delay of the semiconductor integrated circuit depends upon a time constant on interconnection CR (C: interconnection capacity, R: interconnection resistance). However, there is a fear of a state where the constant on interconnection CR can not follow an improvement in switching rate of a transistor because of an increase in interconnection resistance caused by a reduction in line width and an increase in capacity between wirings caused by a reduction in line space. Although an aluminum alloy is used as a wiring material of the semiconductor integrated circuit at present, copper wiring or silver wiring is now under study to reduce the interconnection resistance.

On the other hand, an insulating film material having a dielectric constant lower than that of a silica ($SiO_2$) insulating film used at present is also under study to reduce the capacity between wirings. As the insulating film material having low dielectric constant, for example, fluorine-containing silica (SiOF), porous silica and an organic polymer film (organic insulating film) are known. The fluorine-containing silica has a problem that a wiring metal is corroded with hydrofluoric acid produced by the reaction between fluorine and water or between fluorine and hydrogen in the film, and that the dielectric constant increases by eliminated fluorine. The porous silica is expected in that the dielectric constant is not more than 2.

However, there are some cases where the dielectric constant increases by water condensation in micropores and a break down voltage is lowered. It is lately of urgent necessity to develop an organic polymer film having excellent thermal stability and moisture absorption resistance as an interlayer insulating film for insulating between multi-layer wirings on the semiconductor integrated circuit. With respect to the moisture resistance, it is essential that a hydrophilic group is not contained in the organic monomer and it is desired that the condensation polymerization reaction releasing water is not included in the polymerization reaction from the organic monomer.

The term "organic monomer" in this specification refers to those wherein the polymerization reaction of the organic monomer as a constituent unit occurs to form an organic polymer.

The growth method of such a functional organic polymer film includes a spincoating method of an organic monomer. This spincoating method is a method used widely in the growth of the organic polymer film. In this method, the organic monomer is dissolved in a solvent. The organic monomer dissolved in this solvent is coated on a substrate by the spincoating method. Thereafter, the solvent is removed and the polymerization reaction of the organic monomer proceeds by heating, thereby to form a film on the substrate. As a result, a film having a two-dimensional or three-dimensional network structure, or a polymer film is formed. That is, the structure of the organic monomer becomes a skeleton constituting an organic insulating film as the formed polymer film.

For example, "REAL-TIME FT-IR OF THE REACTION KINETICS FOR THE POLYMERIZATION OF DIVINYL SILOXANE BISBENZOCYCLOBUTENE MONOMERS (Material Research Symposium Proceeding Vol. 227, p. 103, 1991) T. M. Stokich, Jr. W. M. Lee, R. A. Peters (hereinafter referred to as a "reference 1") describes about a growth method of an organic polymer film, using a divinyl siloxane bisbenzocyclobutene monomer (hereinafter referred to as a "DVS-BCB monomer").

(Chemical Formula 1)

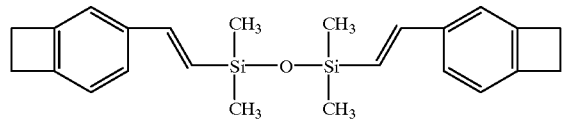

After a dissolved material obtained by dissolving a DVS-BCB monomer in mesitylene is spincoated, mesitylene as the solvent is removed by baking at 100° C. and the residue was further heated to 300–350° C., whereby a carbon four-membered ring in benzocyclobutene causes the thermal ring-opening polymerization reaction and an organic polymer film (hereinafter referred to as a "DVS-BCB polymer film"),wherein a derivative of DVS-BCB represented by the following chemical formula as a principal skeleton grows.

(Chemical Formula 2)

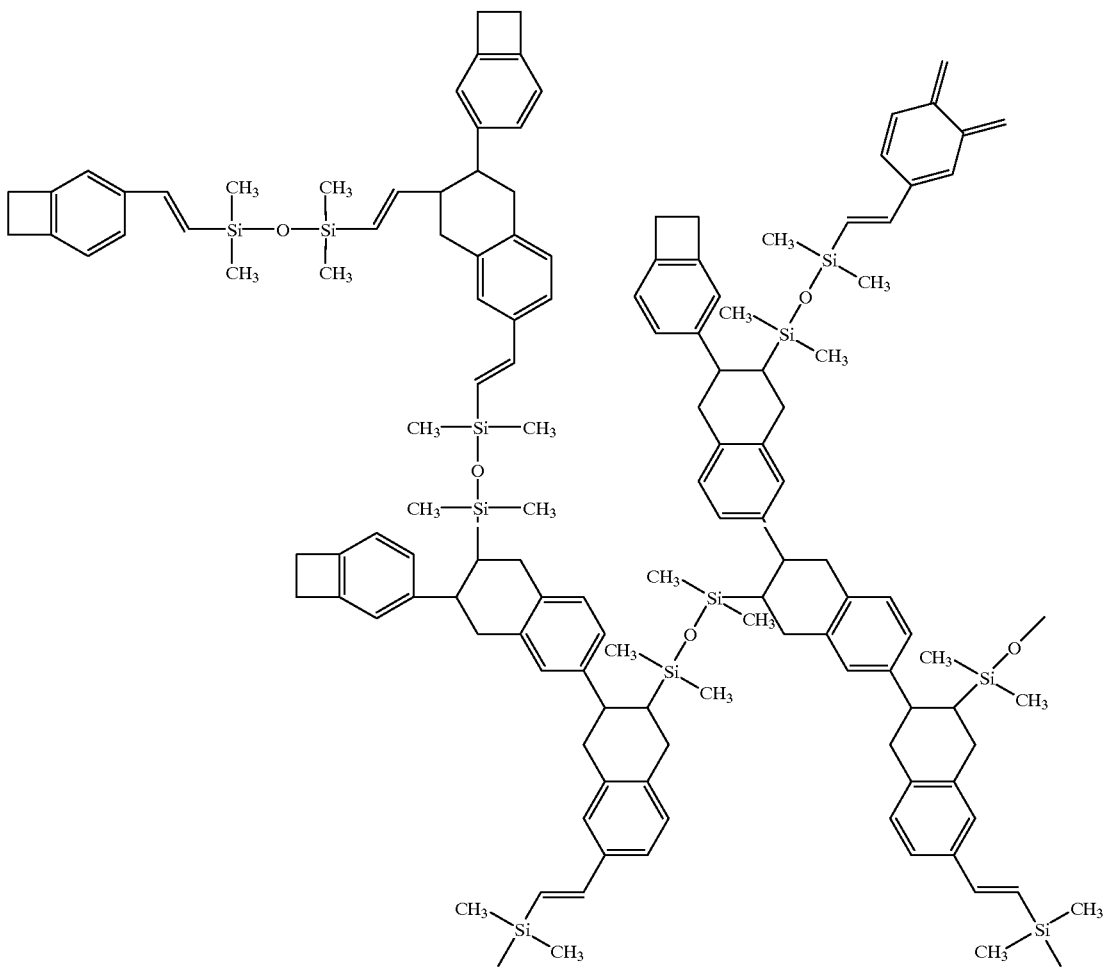

The present inventors have suggested an evaporation method of an organic monomer as the growth method of a functional organic polymer film in JP-A-11-017006. This method is a method of vaporizing an organic monomer and polymerizing the monomer on a substrate in the vapor phase, thereby to obtain an organic polymer film. In FIG. 13, an organic film growth system by direct vaporization of this organic monomer is shown. An organic monomer 1 in a tank 17 is evaporated by heating under reduced pressure. A reaction chamber is connected with an exhaust pump 10 through an exhaust gas piping 40 and the evaporated organic monomer is supplied to a reaction chamber 11 through a vaporized raw material piping 35 by evacuating inside the reaction chamber 11. The organic monomer molecules are adsorbed on the surface of a semiconductor substrate 14 on which a semiconductor integrated circuit is formed. Furthermore, the polymerization reaction proceeds by thermal energy supplied by a substrate heating portion 15, thereby to form an organic insulating film 13.

The spincoating method described above has a drawback that the yield of the organic film is low because about 90% of the dissolved material is scattered from the substrate.

This method is a method of heating a spincoated film in a baking furnace thereby to remove a solvent first, and heating to high temperature to cause the polymerization reaction of the organic monomer thereby to form an organic polymer film. When oxygen is present in the baking furnace, the desired organic polymer film is not obtained sometimes by reacting oxygen with a portion of the organic monomer.

For example, a permissible oxygen concentration, in the case where the dissolved material obtained by dissolving a DVS-BCB monomer in mesitylene is spincoated and then baked, is not more than 100 ppm. For this reason, the atmosphere in the whole baking furnace must be replaced by a nitrogen gas and it is difficult to realize at low cost.

Since the dissolved oxygen in the solvent is sometimes reacted with the organic monomer during baking, precise atmosphere control is required, but it is difficult to control the oxygen concentration in the spincoating method.

Although the spincoating is conducted in a locally evacuated spincoating chamber, there is also a risk of contamination of the spincoated film with floating dust particles or fine particles of the dried organic monomer adhered to the inner wall of the spincoating chamber. In this case, the quality of the film is deteriorated. Furthermore, the spincoating also has a problem that the environmental burden is large because a large amount of an organic solvent is required.

The growth method of a functional organic polymer film by directly vaporizing an organic monomer, which is disclosed in JP-A-11-017006 by the present inventors, was superior in that the yield of the organic film is more better than that of the spincoating method. However, since a method of vaporizing the organic monomer from a vapor-liquid interface is employed, the vaporization of the organic monomer depends largely on a vapor pressure of the organic monomer and the organic monomer must be heated to high temperature. On the other hand, since the organic monomer has reactivity, the polymerization reaction also proceeds at high temperature and the vaporization of the organic monomer has a tendency to be unstable, sometimes. Therefore, an improvement has been required.

SUMMARY OF THE INVENTION

In view of the problems described above, the present invention has been accomplished. That is, an object of the present invention is to provide a growth method of organic polymer film, which makes it possible to control a growth film thickness with high accuracy by efficiently vaporizing an organic monomer, and spraying the vaporized organic monomer on a substrate and conducting the polymerization reaction.

The present invention relates to a growth method of a polymer film, which comprises the steps of:

supplying a predetermined amount of an organic monomer to a vaporization controller at a controlled a flow rate;

heating the organic monomer in this vaporization controller while supplying a carrier gas, thereby to continuously vaporize the organic monomer while maintaining a partial pressure of the organic monomer lower than a saturated vapor pressure; and transporting the carrier gas containing the vaporized organic monomer to a reaction chamber from the vaporization controller, and spraying the gas on the surface of a substrate arranged in the reaction chamber, thereby to grow a polymer film containing a derivative of the organic monomer in a principal skeleton.

In the present invention, since the organic monomer is quantitatively sprayed on the surface of the substrate, the yield of the organic film is high. In addition, the organic polymer film as the product contains a derivative obtained by the polymerization reaction of the organic monomer, which inherits a monomer skeleton. Therefore, the controllability of a polymer film structure, which makes it possible to obtain a polymer film corresponding to the structure of the starting material monomer, is excellent.

In case of the vaporization of the organic monomer which partially has a low vapor pressure and the high starting temperature of polymerization reaction, sufficient vaporization can be attained even under heating at low temperature where the polymerization reaction rate is very small by using a technique of introducing a carrier gas, thereby to reduce the partial pressure of the organic monomer to a pressure lower than the saturated vapor pressure of the organic monomer.

Furthermore, since the polymerization reaction of the organic monomer is allowed to proceed on the substrate in the closed reaction chamber wherein the carrier gas containing this organic monomer is evacuated with a pump, the organic monomer does not react with a reactive gas such as oxygen and there is not a fear of causing deterioration of properties, such as increase in dielectric constant due to partial oxidation of the resulting polymer film.

By supplying a predetermined amount of the organic monomer through a liquid flow controller with controlling the flow rate, it becomes possible to conduct accurately controlled continuous vaporization of a predetermined amount of the organic monomer and the film thickness of the polymer film growing on the substrate can be controlled with high accuracy. Furthermore, by setting the temperature of the vaporized raw material piping and inner wall of the reaction chamber to a vaporization temperature or higher of the organic monomer, reliquefaction of the organic monomer is prevented. In addition, by arranging a trap cooled to the temperature not higher than vaporization temperature of the organic monomer at a front stage of the exhaust pump, reliquefaction and polymerization reaction of the organic monomer in the exhaust pump can be prevented.

According to the present invention, since the organic monomer constituting the organic polymer film to be formed on the semiconductor substrate is vaporized by utilizing a carrier gas, the reaction such as partial oxidation of the polymer film, which causes deterioration of insulating properties and an increase in dielectric constant, does not occur and a high-quality polymer film can be obtained.

DETAILED DESCRIPTION OF THE PREFERRED EMBODIMENTS

Figure 1:
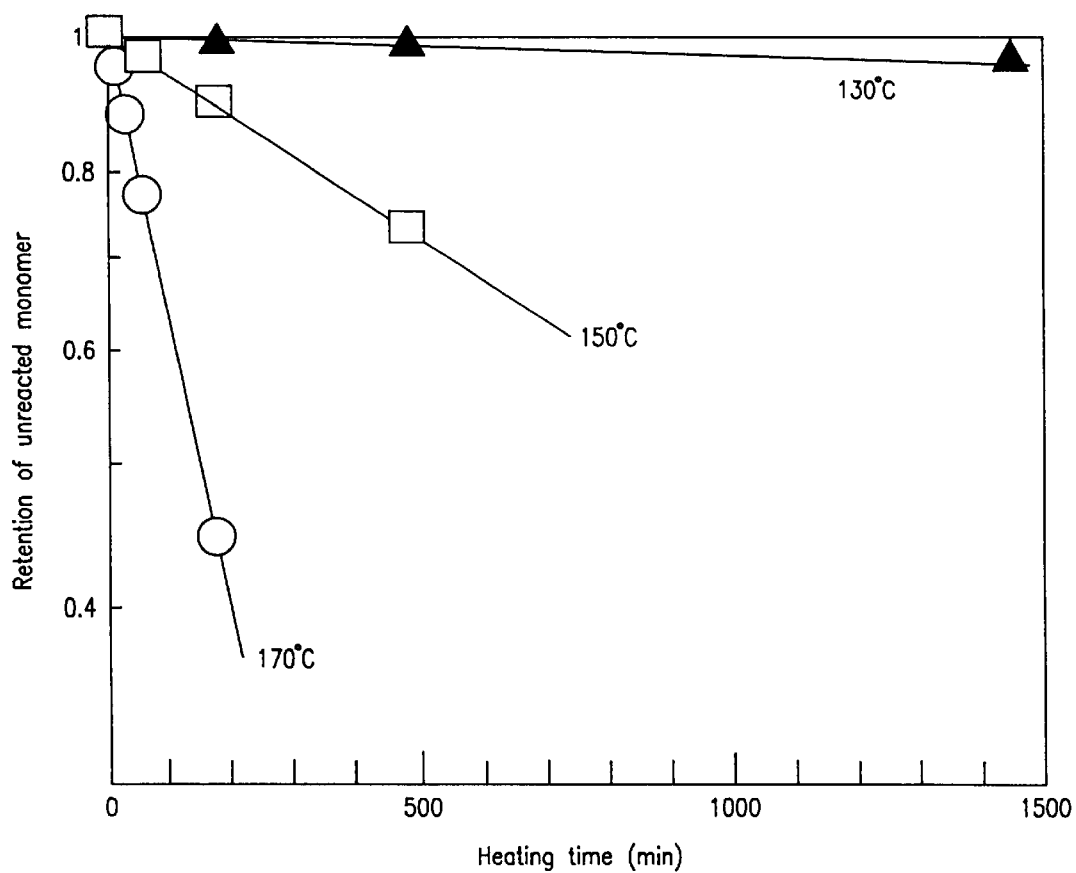
FIG. 1 is a graph showing a relation between the retention of the unreacted monomer and the heating time of a DVS-BCB monomer.

According to the present invention, an organic polymer film is formed on the surface of a substrate by vaporizing an organic monomer, transporting the vaporized organic monomer in a vapor phase using a carrier gas and spraying it on the surface of the substrate arranged in a reaction chamber.

According to a conventional CVD method, for example, when TEOS (tetraethoxy orthosilicate: $Si(OCH_2CH_3)_4$) as a liquid organic silica source to obtain a silicon oxide film in a reaction chamber, a $SiO_2$ film is grown by the chemical reaction in a vapor phase with ozone or oxygen to be supplied from the other piping path in the reaction chamber. In this case, a film ($SiO_2$) having a chemical structure different from that of the starting material (TEOS) grows. On the other hand, when the organic monomer is vaporized like the present invention, the organic monomer transported in the vapor phase causes the polymerization reaction on the substrate. Accordingly, a film having the structure of the starting material as the skeleton grows. To distinguish from a conventional CVD method, the growth method of the polymer film according to the present invention is referred to as a MVP (Monomer-Vapor Polymerization) method hereinafter.

Unlike a conventional CVD method, the MVP method required much consideration because the organic monomer is used. First, the organic monomer generally has low vapor pressure and the polymerization reaction occurs when the organic monomer is heated to high temperature to increase the vapor pressure. When the organic monomer is transported in the vapor phase in the piping, the reliquefaction occurs easily because of low vapor pressure.

In the present invention, a method of assisting the vaporization of the organic monomer by supplying both of the carrier gas and organic monomer to the vaporization controller was employed. The vaporization conditions in the case where the organic monomer is vaporized without using a carrier gas are represented by the following expression:

$$P < Pm \quad \text{(Expression 1)}$$

where Pm (Torr) is a saturated vapor pressure of an organic monomer, C (sccm) is an amount of a carrier gas to be supplied, S1 (g/min) is a rate of a liquid organic monomer to be supplied, Mm (g/mol) is a molecular weight of an organic monomer and P is a total pressure in a vaporization controller. In the case of the organic monomer of the present invention, since the saturated vapor pressure is several mTorr even under heating to 100° C., it is necessary to make the atmosphere inside the vaporization controller ultra-high vacuum.

On the other hand, when using the carrier gas, when the partial pressure of the organic monomer is lower than the saturated vapor pressure, the vaporization can occur. The partial pressure of the organic monomer is represented by the product of the total pressure P in the vaporization controller and molar fraction. Assume that the supplied organic monomer is entirely vaporized, when the rate of the carrier gas to be supplied is C (sccm), the molar fraction Rm of the organic monomer in the vaporization control chamber is approximately calculated by the following equation.

$$Rm = \{\{S1(g/mol)/Mm(g/mol) \times 22400(cc/mol)\}/C(sccm)$$

As a result, the vaporization conditions are represented by the following expression.

$$P \times Rm < Pm \quad \text{(Expression 2)}$$

Accordingly, as the molar fraction of the organic monomer is reduced by increasing the flow rate of the carrier gas, the whole pressure required to vaporize the organic monomer in the vaporization controller becomes higher. For example, assume that the organic monomer is diluted 1000 times with the carrier gas, even if the saturated vapor pressure at 100° C. of the organic monomer is 1 mTorr, the vaporization occurs only by adjusting the total pressure in the vaporization controller to several Torr.

Incidentally, the total pressure of the vaporization controller also depends upon an exhaust capability of the exhaust pump to be connected with the vaporization controller and upon a pressure loss of the vaporized raw material piping for connecting the vaporization controller with the reaction chamber. Therefore, the flow rate of the carrier gas has an optimum range.

The heating temperature of the organic monomer in the vaporization controller is also limited. Hereinafter this heating temperature is defined as a vaporization temperature, but the saturated pressure Pm of the organic monomer changes largely with the vaporization temperature, for example, 1 mTorr (100° C.), 50 mTorr (150° C.) and 300 mTorr (180° C.). Considering only the vaporization, the higher the vaporization temperature, the better. However, the polymerization rate of the organic monomer also increases. When the polymerization reaction occurs to form a dimer or trimer, it becomes impossible to vaporize it because its saturated vapor pressure is much lower than that of the monomer.

Although this polymerization reaction rate is also a function of temperature, the polymerization reaction can be negligible when evaporating before the polymerization reaction takes place. Actually, the polymerization reaction could be neglected when the polymerization rate of the organic monomer to be supplied was not more than one-hundredth a supply rate of the organic monomer.

Furthermore, once vaporized organic monomer is liquefied again when cooling to the temperature lower than the vaporization temperature. Accordingly, the temperature is controlled so as not to be such a vaporization temperature or lower during the process from the vaporization controller to the reaction chamber. That is, reliquefaction of the organic monomer is avoided by previously adjusting the carrier gas temperature to the same temperature as the vaporization temperature and previously adjusting the temperature of the vaporized raw material piping and that of the reaction chamber inner wall to the temperature which is the same as or higher than the vaporization temperature.

It is difficult to always maintain the temperature of the inside of the exhaust pump for evacuating the vaporization controller and reaction chamber at the temperature higher than the vaporization temperature (e.g. 150–200° C.). Accordingly, it is preferred to recover the organic monomer by providing a low-temperature recovering trap for organic monomer where the temperature of the trap is sufficiently lower than the vaporization temperature at a front stage of the exhaust pump so that the organic monomer is not liquefied again. As such a low-temperature recovering trap for organic monomer, for example, a water-cooled trap cooled to about 10–30° C. can be suitably used.

As the organic monomer, any organic monomer having a reactive functional group for polymerization can be used in the method of producing the polymer film of the present invention. The state of the organic monomer is preferably liquid considering ease of supplying to the vaporization controller. Most preferred is a monomer which is liquid at room temperature, but it is possible to supply in the liquid state by heating a monomer, which is solid at room temperature, to a temperature at which the polymerization does not become noticeable (polymerization rate >1%/min).

For example, as the growth method of the DVS-BCB polymer film in the case where an interlayer insulating film is formed on a semiconductor substrate, the method of the present invention is effective. The DVS-BCB monomer used in one embodiment is an organic monomer used particularly in the case where an interlayer insulating film having low dielectric constant is formed on a semiconductor substrate.

In that case, it is possible to appropriately use gases which are inert to the organic monomer (e.g. hydrogen gas, nitrogen gas, helium gas, argon gas, neon gas, etc.) as the carrier gas of the organic monomer. Particularly, when the DVS-BCB monomer is used as the organic monomer, the growth stability of the polymer film is enhanced by using a helium gas having high thermal conductivity and an ultra-high speed semiconductor integrated circuit can be produced in high yield, which is preferred.

EXAMPLE 1

As one example of the embodiments of the present invention, the growth of an organic polymer film according to the MVP method using divinyl cyclohexane bisbenzocyclobutene (molecular weight: 390 g/mol) as an organic monomer will be described below with reference to the accompanying drawings.

First, dependence of the organic monomer polymerization rate on temperature is shown as basic physical properties required to conduct the MVP method using the DVS-BCB monomer as the organic monomer.

In this example, a change in molecular weight with a heating time was measured by the GPC (Gel Permeation Chromatography) and an unpolymerization degree $(1-\alpha)$ of the DVS-BCB monomer was calculated. A relation between the logarithm of the unpolymerization degree $(1-\alpha)$ and the heating time is shown in FIG. 1. The logarithm of the unpolymerization degree $(1-\alpha)$, that is, log $(1-\alpha)$ decreases linearly with the heating time, which shows that the polymerization reaction proceeds in accordance with a primary reaction rate formula. The higher the heating temperature, the larger an inclination of the log $(1-\alpha)$ against this heating time becomes.

For example, when the monomer is heated for 1 minute, only 0.03% of the monomer was polymerized in the case of heating to 150° C. In the case of heating to 170° C, the amount increases to 0.24% and, in the case of heating to 180° C., the amount reached 1% or higher. Accordingly, since the polymerization reaction inhibits the vaporization, the vaporization temperature has an upper limit. This upper limit temperature will be described hereinafter.

Figure 2:
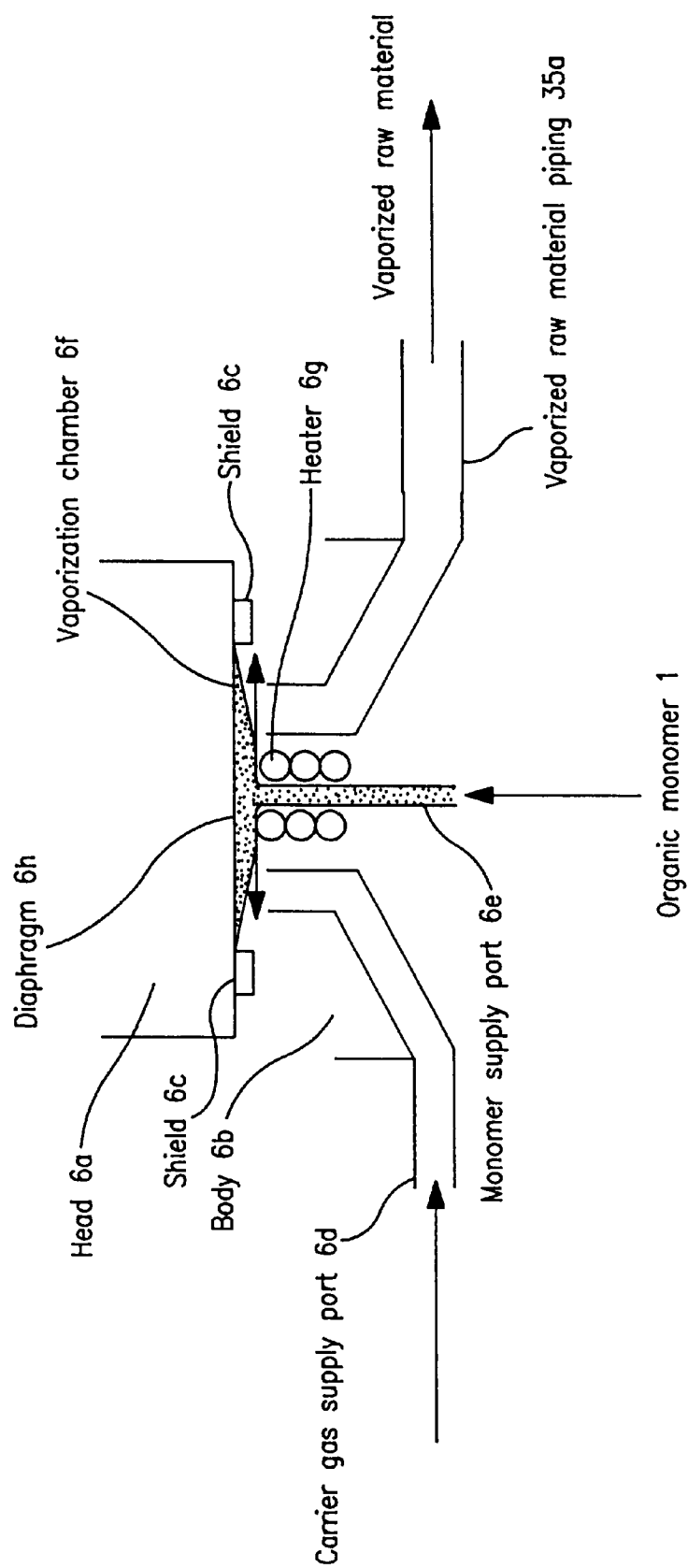
FIG. 2 is schematic sectional view showing a vaporization controller as one embodiment according to the present invention.

Although the organic monomer having such polymerization characteristics is vaporized by supplying the carrier gas, a direct liquid injection system shown in FIG. 2 was employed as the vaporization controller in this example. Explanation will be made below with reference to FIG. 2 and FIG. 5.

This vaporization controller has such a configuration that a small gap space between a head 6a and a body 6b, interposing a shield 6c, is formed as a vaporization chamber 6f and a carrier gas is supplied to this vaporization chamber 6f from a carrier gas supply port 6d of the body 6b, whereas, a DVS-BCB monomer (organic monomer 1) is supplied to the vaporization chamber from an organic monomer supply port 6e.

The organic monomer 1 is heated to a predetermined temperature by a heater 6g for heating the periphery of this organic monomer supply port 6e and the periphery of the surface of the body 6b. The vaporization chamber 6f is evacuated through a vaporized raw material piping 35a connected with a reaction chamber 11 by using an exhaust pump 10, and then the vaporized organic monomer 1 is carried out by a carrier gas. After a diaphragm valve 6h attached to a head just above the monomer supply port 6e is driven up and down by a piezo element, thereby to supply the organic monomer at a fixed flow rate, an opening portion of the organic monomer supply port 6e is closed. This vaporization controller exerts good thermal efficiency because the vaporization is conducted only by heating a small amount of the organic monomer to be supplied in the vaporization controller, and is suitably used when using the organic monomer, which has low saturated vapor pressure and is capable of easily causing the polymerization reaction by heating for a long time, like the present invention.

With respect to the vaporization conditions in the case where such a vaporization controller 6 is used, a total pressure P of the vaporization chamber 6f becomes a function of the flow rate of the carrier gas when the evacuation capability of the exhaust pump is fixed. In this example, the saturated vapor pressure of the organic monomer is neglected because it is too small.

Figure 3:
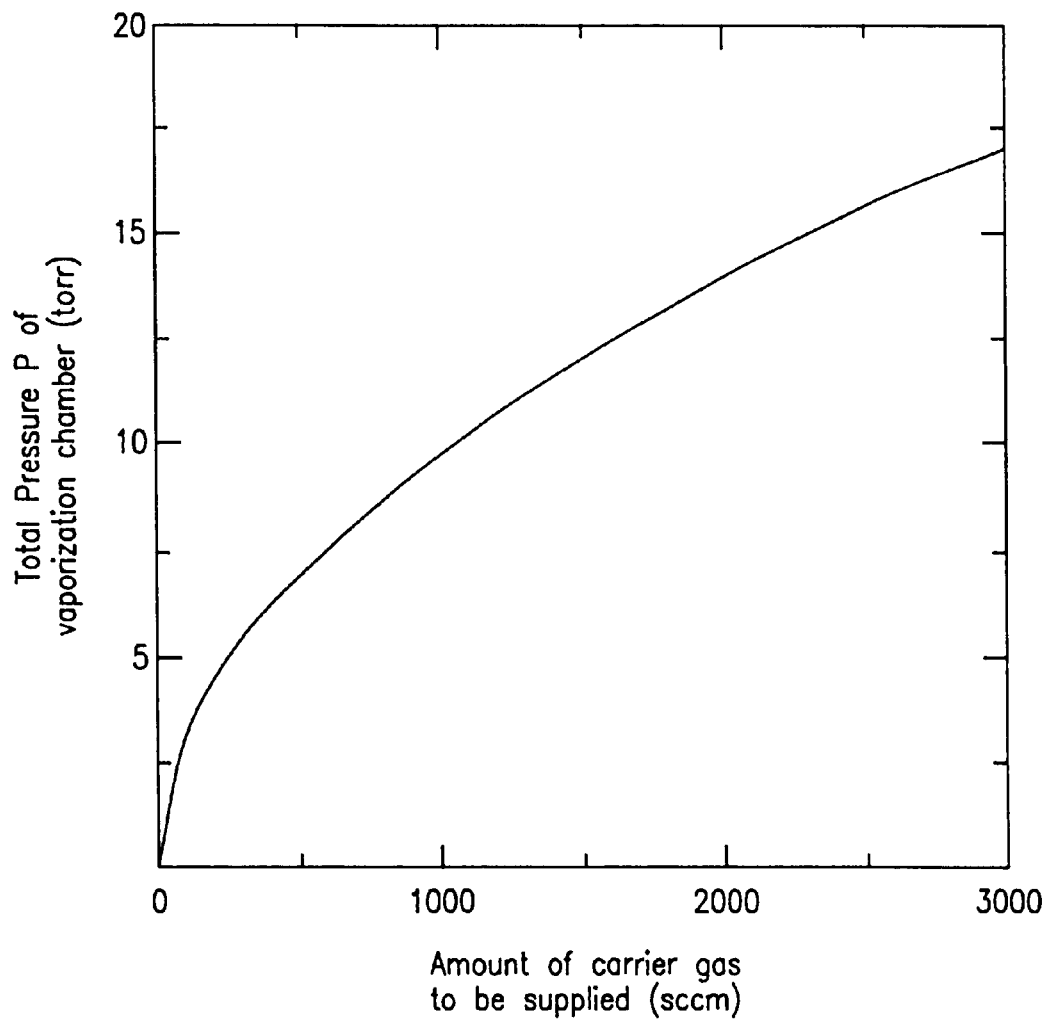
FIG. 3 is a graph showing a relation between the total pressure P of a vaporization chamber and the flow rate of a He carrier gas in a vaporization controller as one embodiment according to the present invention.

It is the necessary condition that the carrier gas does not contain oxygen and water. In the case of the organic monomer which has low saturated vapor pressure and is sensitive to the temperature, the thermal conductivity is preferably high. Most preferred one is He, but Ar or $N_2$, which does not react with the organic monomer, is also preferred. One example of the total pressure P (Torr) in the vaporization controller used in the present invention and the amount C (sccm) of the He carrier gas to be supplied is shown in FIG. 3. With the increase of the flow rate of the carrier gas, the total pressure in the vaporization chamber increases. That is, the total pressure P in the vaporization chamber is expressed by P (C).

The saturated vapor pressure Pm of the DVS-BCB monomer (organic monomer 1) increases with an increase in temperature like an exponential function. For example, the saturated vapor pressure is 0.078 Torr at 125° C., 0.047 Torr at 150° C. and 0.21 Torr at 175° C., respectively. That is, the saturated vapor pressure Pm is a function of temperature and is expressed by Pm (T).

The vaporization conditions of the organic monomer in the case where the carrier gas is used can be represented by the (expression 2). This expression is rewritten as follows.

$$S1 < v(C, T) \quad \text{(Expression 3)}$$

where $v (C, T) = \{Mm \times C/22400\} \times \{Pm (T)/P (C)\}$

Therefore, the condition range of the amount (C) of the carrier gas to be supplied and the rate S1 (g/min) of the organic monomer to be supplied, which are required to vaporize a fixed amount of the organic monomer to be supplied to the vaporization controller, is determined. In the formula (3), C (sccm) is an amount of a carrier gas to be supplied, S1 (g/min) is a rate of a liquid organic monomer to be supplied, Mm (=390 g/mol) is a molecular weight of an organic monomer, P is a total pressure in a vaporization controller and T is a vaporization temperature.

Specifically, a relation between the vaporization temperature T and the maximum amount C of the monomer to be supplied, including the rate of the carrier gas to be supplied as a parameter, is determined by substituting a relation between the total pressure P and the rate of the carrier gas to be supplied (FIG. 3) and a relation between the unsaturated vapor pressure and temperature (vaporization temperature) of the DVS-BCB monomer in the (expression 3) and multiplying the right side of the (expression 3) by a vaporization safety factor ($\beta=0.5$ in this example). This vaporization characteristic curve depends on the configuration of the vaporization controller and varies with the setting of the vaporization safety factor $\beta$. One example will be shown in FIG. 4.

In the case where the amount of the carrier gas to be supplied is fixed, the higher the vaporization temperature, the more the maximum amount of the organic monomer to be supplied increases. This is caused by an increase in saturated vapor pressure of the organic monomer due to an increase in vaporization temperature. Although the vaporization of the organic monomer proceeds stably in the region under such a characteristic curve, it is apparent that this stable vaporized region is enlarged by an increase in supply rate of the carrier gas.

On the other hand, with the increase of the vaporization temperature, the polymerization rate of the organic monomer increases thereby to inhibit the vaporization, as shown in FIG. 1. That is, the vaporization depends on a relative relation between the vaporization rate and the polymerization rate of the organic monomer. It became apparent to be suited for practical use if the polymerization rate of the organic monomer is not more than one-hundredth the vaporization rate.

Figure 4:
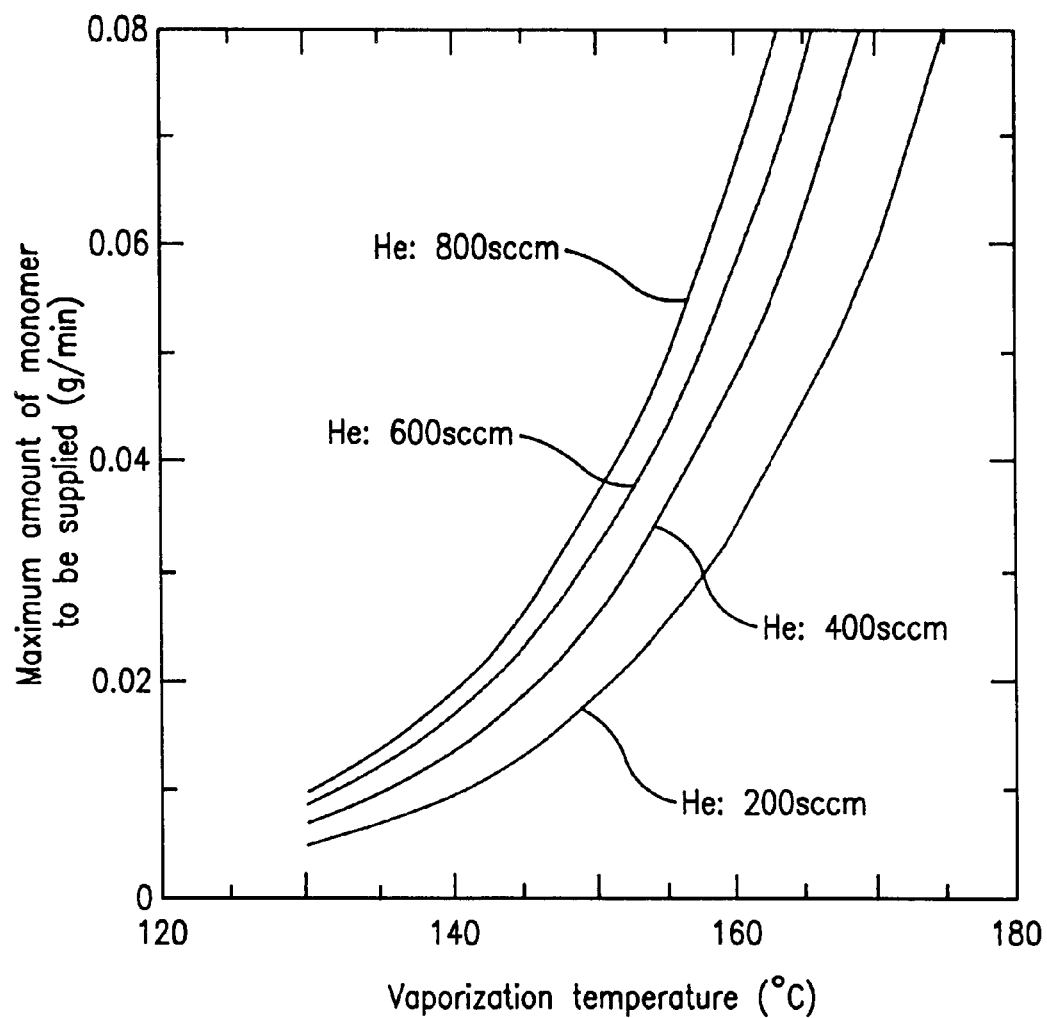
FIG. 4 is a vaporization characteristic graph showing a relation between the vaporization temperature of a DVS-BCB monomer and the maximum amount of the monomer to be supplied in a vaporization controller as one embodiment according to the present invention.

In the vaporization of the DVS-BCB monomer due to a He carrier gas, a vaporization temperature, an amount of a carrier gas to be supplied and an amount of an organic monomer to be supplied were set from the vaporization characteristic curve shown in FIG. 4. Specifically, divinyl siloxane bisbenzocyclobutene was vaporized by supplying 100–3000 sccm of a carrier gas in a vaporization controller which maintained the total pressure of not more than 20 Torr, supplying a DVS-BCB monomer at a rate of 0.1–0.01 g per minute in the vaporization controller, and heating within a temperature range from 100 to 175° C.

Figure 5:
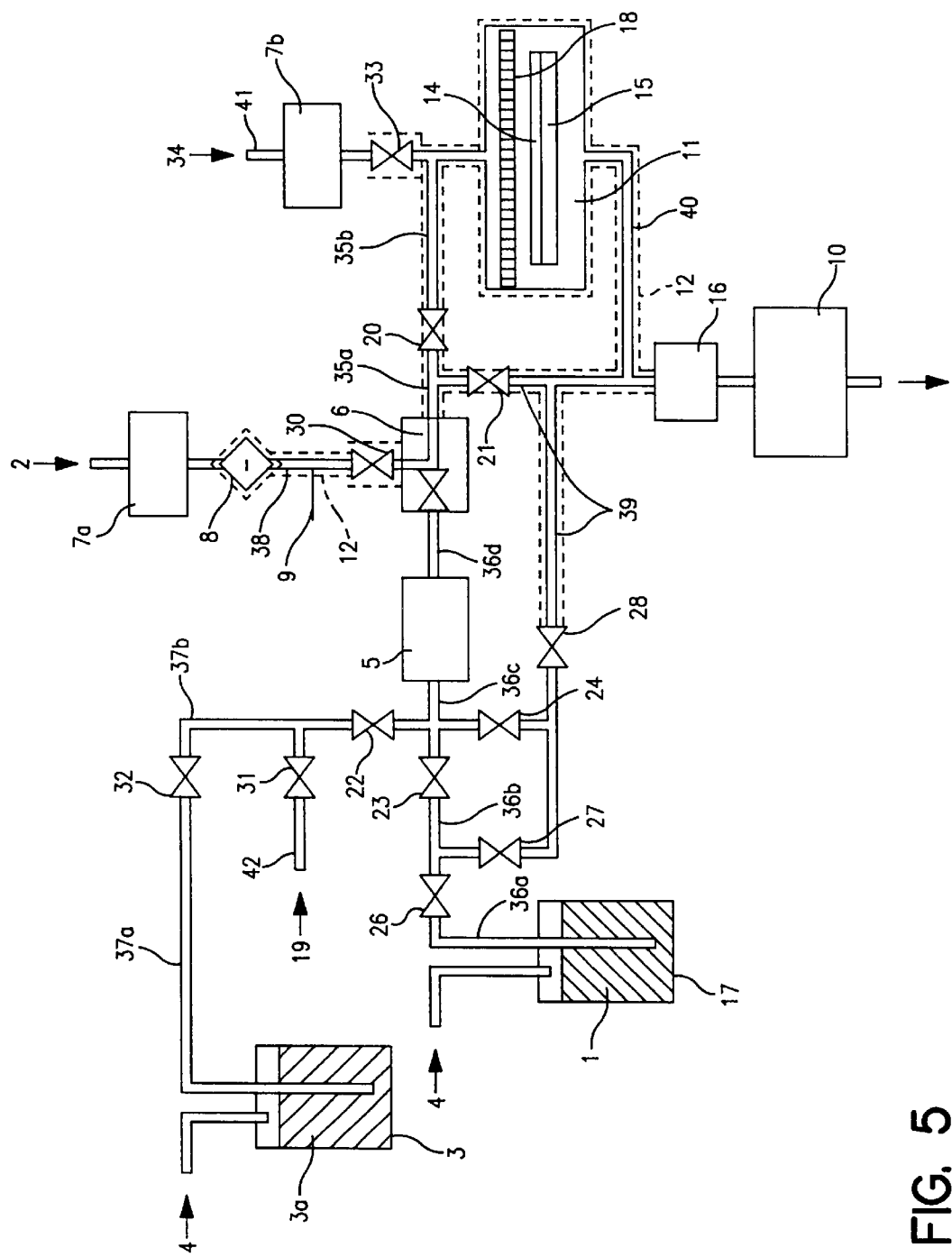
FIG. 5 is a schematic flow sheet of a polymer film growth system of Example 1 according to the present invention.
Figure 6:
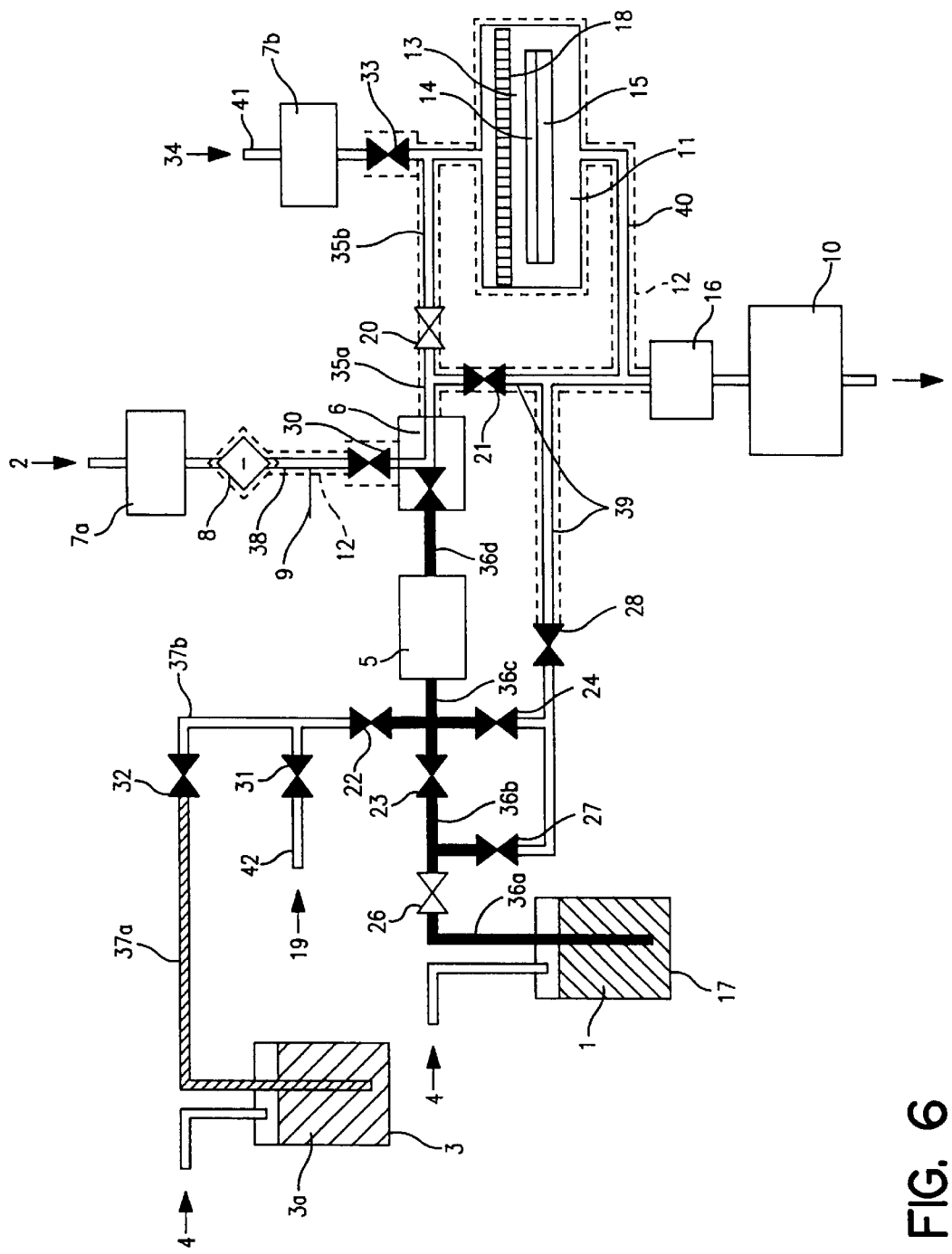
FIG. 6 is a growth flow sheet of a DVS-BCB polymer film using the polymer film growth system of Example 1 according to the present invention.

A polymer film growth system using such a vaporization controller is shown in FIG. 5. The polymer film growth system mainly comprises an organic monomer tank 17, a liquid flow indicator 5, a vaporization controller 6, a carrier gas heating filter 8, gas flow controllers 7a,7b, a reaction chamber 11, a piping heater 12, a cooling trap 16, an exhaust pump 10 and a washing solvent tank 3, and is further provided with pipings for introducing a carrier gas 2, a cleaning gas 34, a purge gas 19 and a pressure delivery gas 4, and control valves (valves A–N). The organic monomer tank 17 is filled with a DVS-BCB monomer, while mesitylene (washing solvent 3a) is reserved in the washing solvent tank 3. Any of the carrier gas 2, purge gas 19 and pressure delivery gas 4 is helium (He).

The cleaning gas 34 is a mixed gas of $SF_6$ and oxygen or ozone. A mixed gas of a fluorocarbon gas such as $CF_4$, $C_2F_6$, etc. and oxygen or ozone may also be used.

The present: invention relates to vaporization of the organic monomer and growth of the polymer film, and the subsequent piping washing process is not referred in the present invention. Therefore, there are valves and pipings, which are not operated, in the examples described below.

A series of processes from vaporization of the DVS-BCB monomer to growth of the DVS-BCB polymer film using the polymer film growth system will be described with reference to FIG. 2 and FIGS. 6–11 (In the drawings, white valve denotes the state of being "opened", while black valve denotes the state of being "closed").

First, in an initial state (FIG. 6), a diaphragm valve 6h in the vaporization controller, a valve 21 and a valve 28 were opened, and then an exhaust gas piping 40, a waste water piping 39, a vaporization controller 6, a liquid flow indicator 5, vaporized raw material pipings 35a,35b and organic monomer pipings 36c,36d were evacuated by using an exhaust pump 10. A carrier gas supply piping 38, a vaporized raw material pipings 35a,35b, a waste water piping 39 and an exhaust gas piping 40 were heated to the temperature, which is the same as the preset vaporization temperature of the organic monomer or slightly higher than the vaporization temperature within the range where the polymerization reaction of the organic monomer does not become noticeable (polymerization rate >1%/minute), by using a piping heater 12. For example, when the vaporization temperature of the DVS-BCB monomer is adjusted to 150° C., the piping heating temperature is adjusted to 170° C. The piping temperature is monitored by using a thermocouple 9 arranged each place of the pipings, thereby to control the piping heater so as to usually secure the preset temperature.

Figure 7:
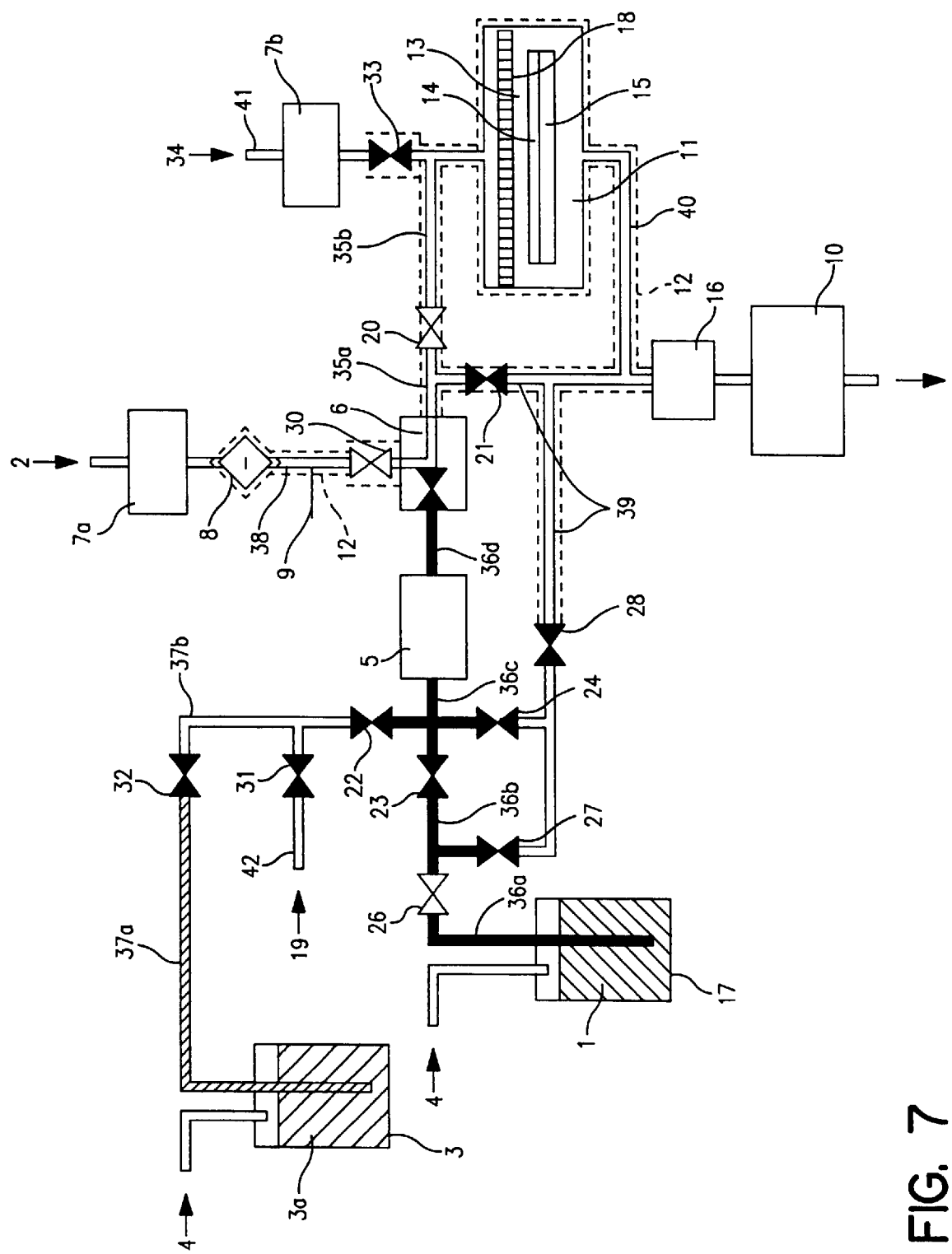
FIG. 7 is a growth flow sheet of a DVS-BCB polymer film using the polymer film growth system of Example 1 according to the present invention.

As shown in. FIG. 7, the diaphragm valve 6h in the vaporization controller and valve 21 were closed and a valve 30 and a valve 20 were opened. Then, a carrier gas (He) 2 was supplied to the vaporization controller 6 through a gas flow controller 7a and a carrier gas heating filter 8 by using a carrier gas supply piping 38. Furthermore, the carrier gas was transferred to the reaction chamber 11 through vaporized raw material pipings 35a,35b, and then exhausted out of the apparatus by using the exhaust pump 10.

In this example, the vaporization controller was heated to 150° C. and the He gas was heated to the same temperature as the vaporization temperature by using a carrier gas heating filter 8. By previously heating the He gas to be introduced in the vaporization controller 6 to the vaporization temperature, the reliquefaction of the vaporized DVS-BCB monomer due to a reduction in temperature is prevented. In this example, a preliminary heating temperature of the carrier gas is generally adjusted to the same temperature as the vaporization temperature, but it is also possible to heat to the temperature at which the polymerization reaction of the organic monomer does not become noticeable (polymerization rate >1%/min), for example, about 175° C. for DVS-BCB. Incidentally, this preliminary heating temperature must be adjusted so as not to exceed the heat-resisting temperature (e.g. 200° C., etc.) of the valve used in this polymer film growth system. In this example, the He carrier gas flow rate was adjusted to 500 sccm based on the vaporization characteristic curve at the vaporization temperature of 150° C. of the DVS-BCB monomer. In the case of this condition, the total pressure P of the vaporization controller was 7 Torr and that of the reaction chamber 11 was 2.0 Torr. A silicon substrate (semiconductor substrate) 14, on which a semiconductor integrated circuit is formed, was heated to 300° C. by a substrate heating portion 15 arranged in the reaction chamber 11. The substrate heating temperature in the case of using DVS-BCB is suitably within a range from 250 to 400 C.

Figure 8:
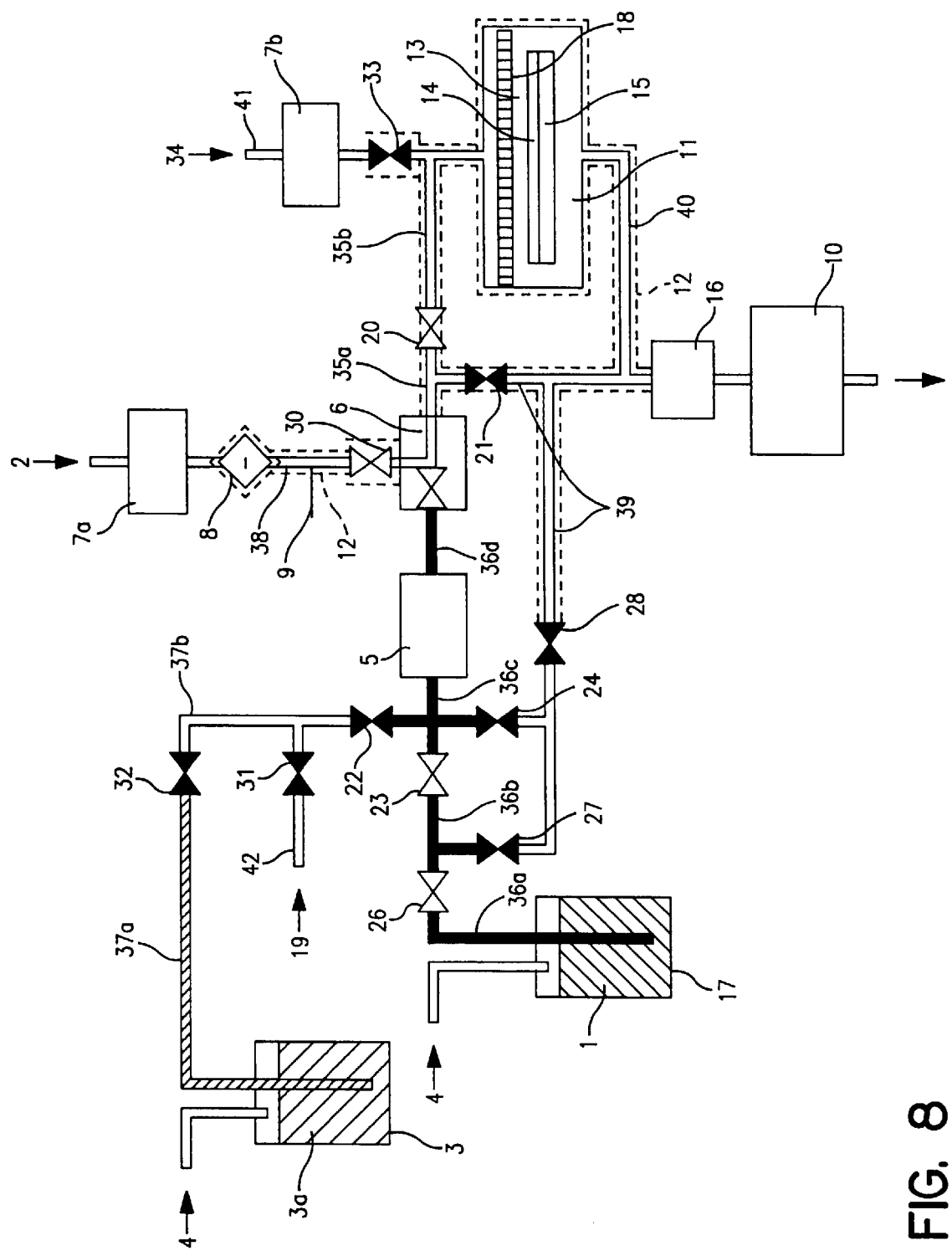
FIG. 8 is a growth flow sheet of a DVS-BCB polymer film using the polymer film growth system of Example 1 according to the present invention.

As shown in FIG. 8, a valve 23 was then opened and a DVS-BCB monomer was supplied to the liquid flow indicator 5 from the organic monomer tank 17 through organic monomer pipings 36a,36b,36c by using the pressure delivery gas (He) 4. The DVS-BCB monomer was fed to the vaporization controller 5 with accurately controlling the rate of the DVS-BCB monomer to be supplied. According to the vaporization degree of the flow rate of the He carrier gas of 500 sccm and the vaporization temperature of 150° C., the rate of the DVS-BCB monomer to be supplied was adjusted to 0.03 g/min. At this stage, the diaphragm valve 6h in the vaporization controller was closed.

Figure 9:
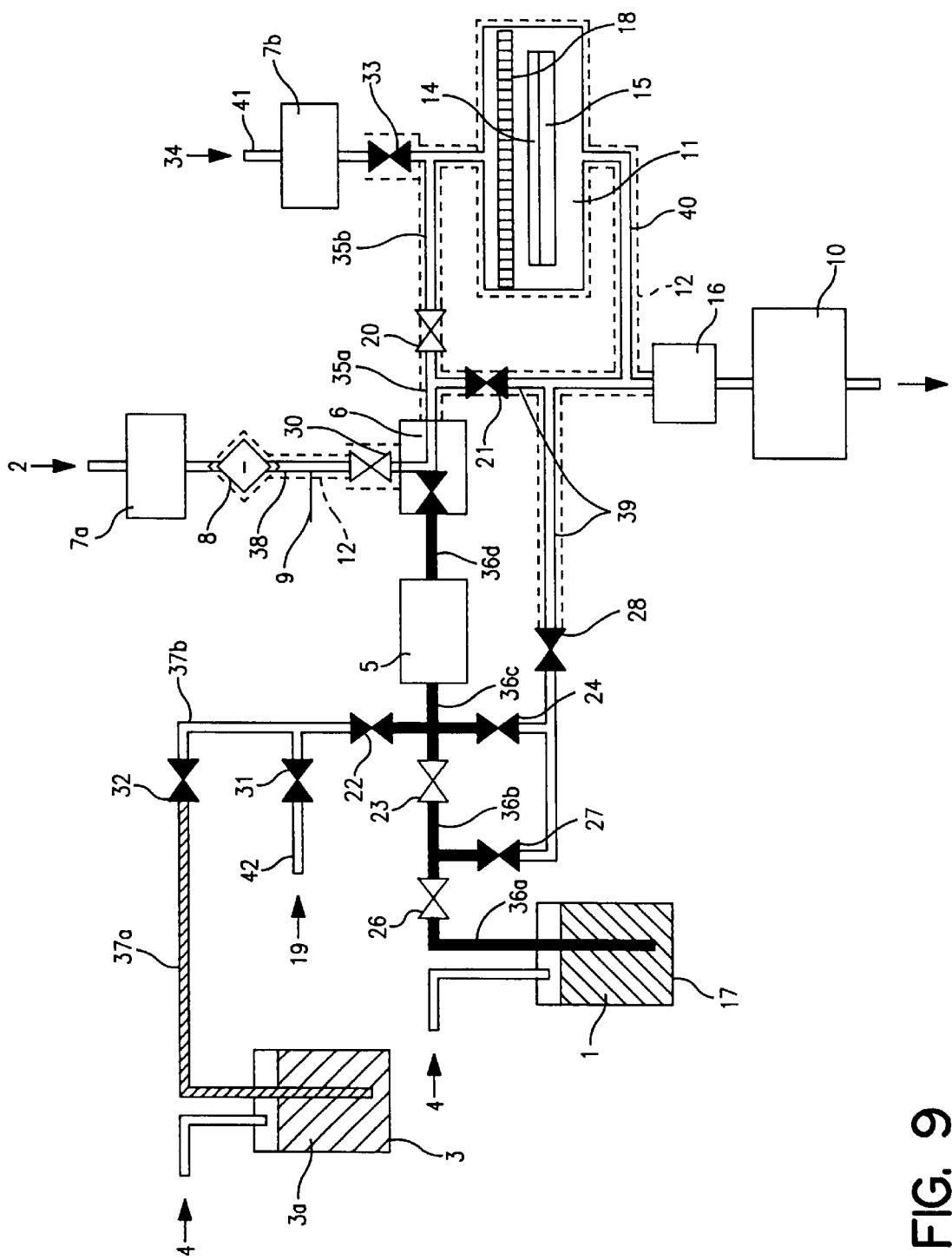
FIG. 9 is a growth flow sheet of a DVS-BCB polymer film using the polymer film growth system of Example 1 according to the present invention.

As shown in FIG. 9, the diaphragm valve 6h in the vaporization controller 6 was then opened and the DVS-BCB monomer was vaporized. The vaporized DVS-BCB monomer was dispersed by a shower head 18 in the reaction chamber 11, together with the He carrier gas, and then sprayed on the silicon substrate 14. On the surface of the substrate heated to 300° C., the polymerization reaction of the DVS-BCB monomer occurred to form a DVS-BCB polymer film (organic insulating film) 13. When the adsorption efficiency of the monomer is 20%, it is necessary to supply about 0.15 g of the DVS-BCB monomer so as to grow a DVS-BCB film of 1 μm on the surface of a 8 inch substrate. Accordingly, the DVS-BCB monomer was supplied from the liquid flow indicator 5 at a flow rate of 0.03 g/min for 5 minutes. In this case, unpolymerized DVS-BCB monomer is contained in an exhaust piping 40, but the DVS-BCB monomer was accumulated in a cooling trap cooled to about 20° C. by water cooling and did not penetrate into the exhaust pump 10.

Figure 10:
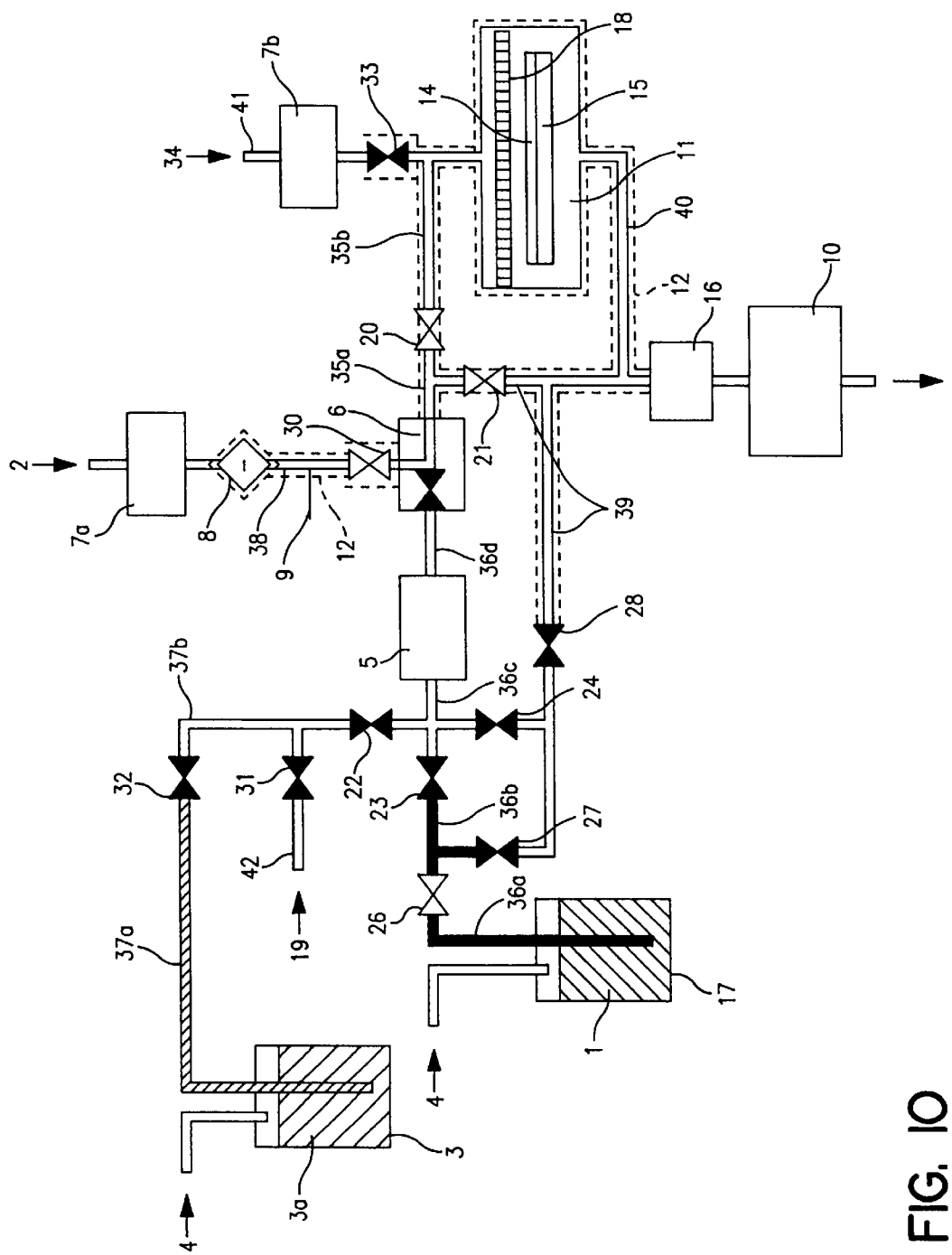
FIG. 10 is a growth flow sheet of a DVS-BCB polymer film using the polymer film growth system of Example 1 according to the present invention.
Figure 11:
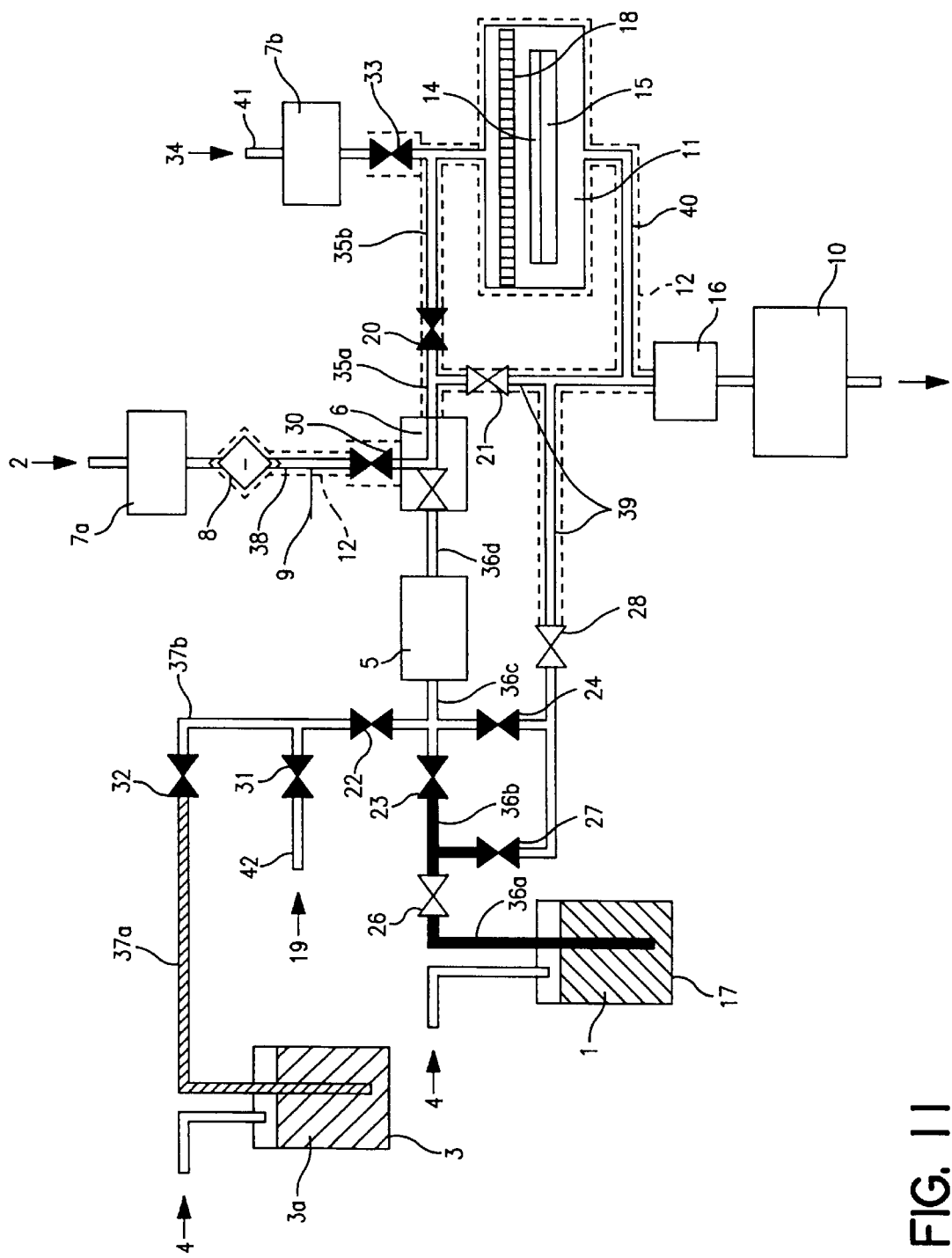
FIG. 11 is a growth flow sheet of a DVS-BCB polymer film using the polymer film growth system of Example 1 according to the present invention.

After a predetermined amount of the DVS-BCB monomer was vaporized, the diaphragm valve 6h in the vaporization controller was closed as shown in FIG. 10. Thereafter, as shown in FIG. 11, the valve 30 was closed thereby to terminate the supply of the He carrier gas 2. After the silicon substrate 14 in the reaction chamber was removed, a new silicone substrate was placed in the reaction chamber 11 and a step of growing a DVS-BCB polymer film on the new silicone substrate by the supply of the He carrier gas and the supply of the DVS-BCB monomer to the vaporization controller 6 shown in FIG. 8 and FIG. 9 was repeated.

Figure 12:
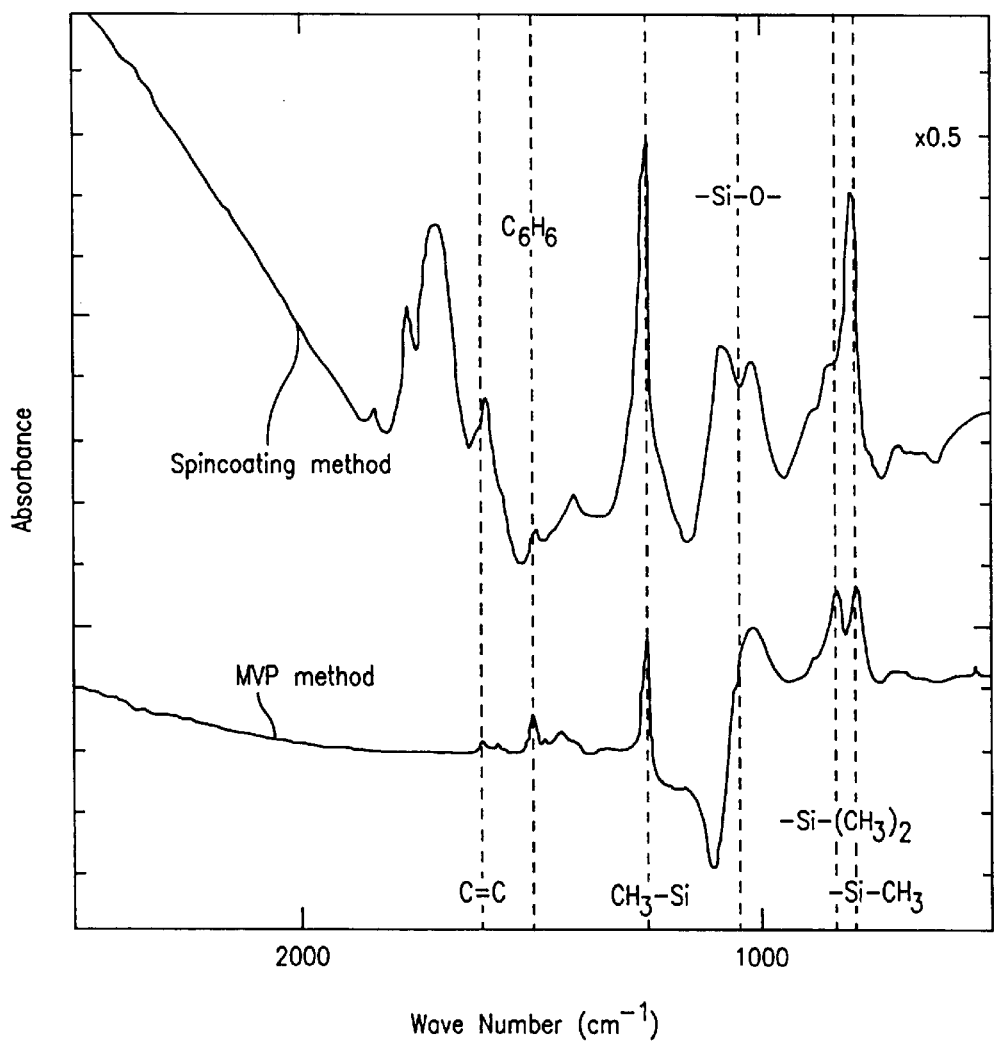
FIG. 12 is an infrared spectrum chart of a DVS-BCB polymer film formed by using the polymer film growth system of Example 1 according to the present invention.
Figure 13:
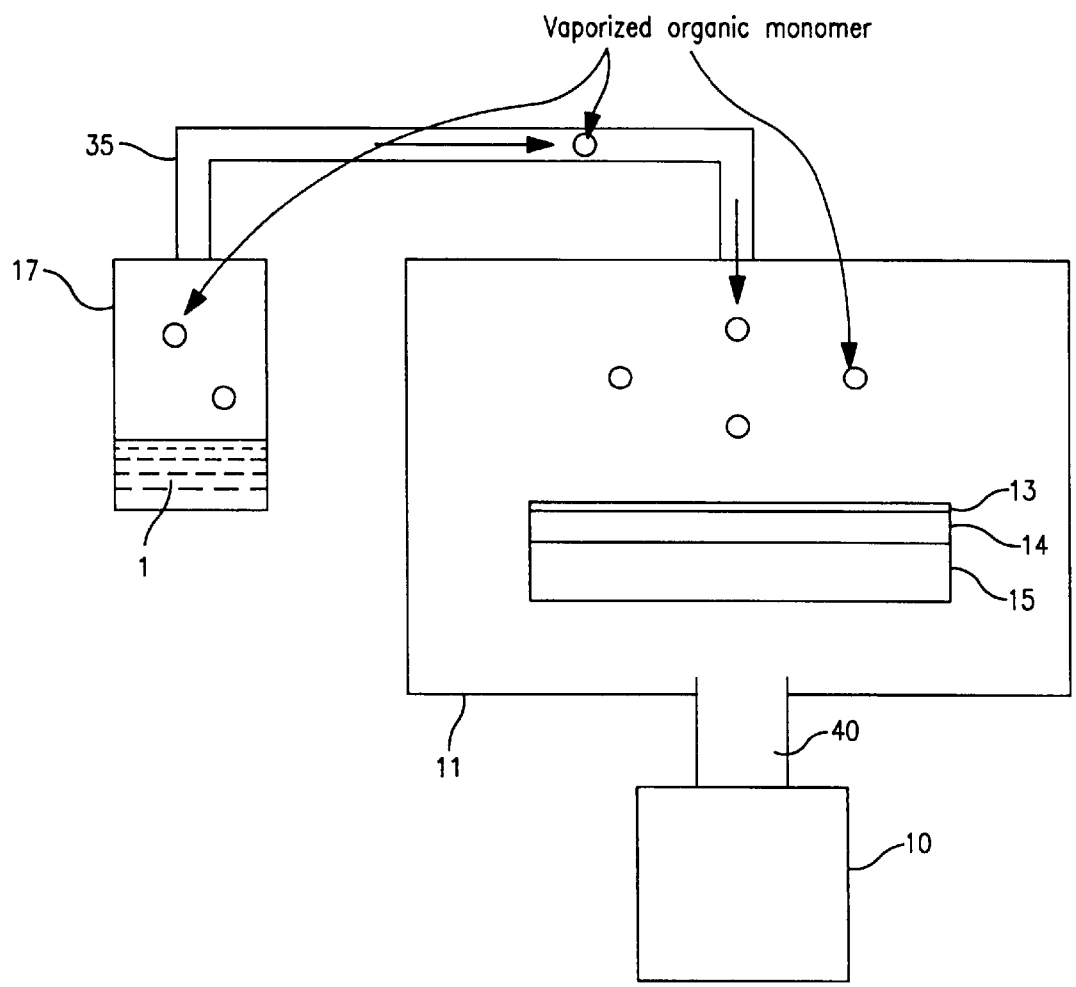
FIG. 13 is an explanation view of a conventional method of forming a polymer film by vaporizing an organic monomer.

FIG. 12 is a graph showing an infrared absorption spectrum of a DVS-BCB polymer film obtained from the DVS-BCB monomer vaporized by using the polymer film growth system according to the present invention and an infrared absorption spectrum of a DVS-BCB film obtained by the spincoating method shown in the reference 1. It is apparent that the resulting absorption spectrum is almost the same as that in case of the spincoating method and the DVS-BCB film is formed. However, regarding the DVS-BCB polymer film obtained by the spincoating method, the absorbance of infrared spectrum increases in the region of 1700 to 1900 ($cm^{-1}$). It is considered that this absorption is caused by oxidation of the DVS-BCB polymer film and is caused by contamination with oxygen in the film-forming process of the spincoating method.

On the other hand, such absorption of infrared spectrum was not recognized in the DVS-BCB polymer film vaporized by using the polymer film growth system because the DVS-BCB polymer film was grown under severe control of the atmosphere free from oxygen. The dielectric constant of this DVS-BCB polymer film was 2.7

EXAMPLE 2

Figure 14:
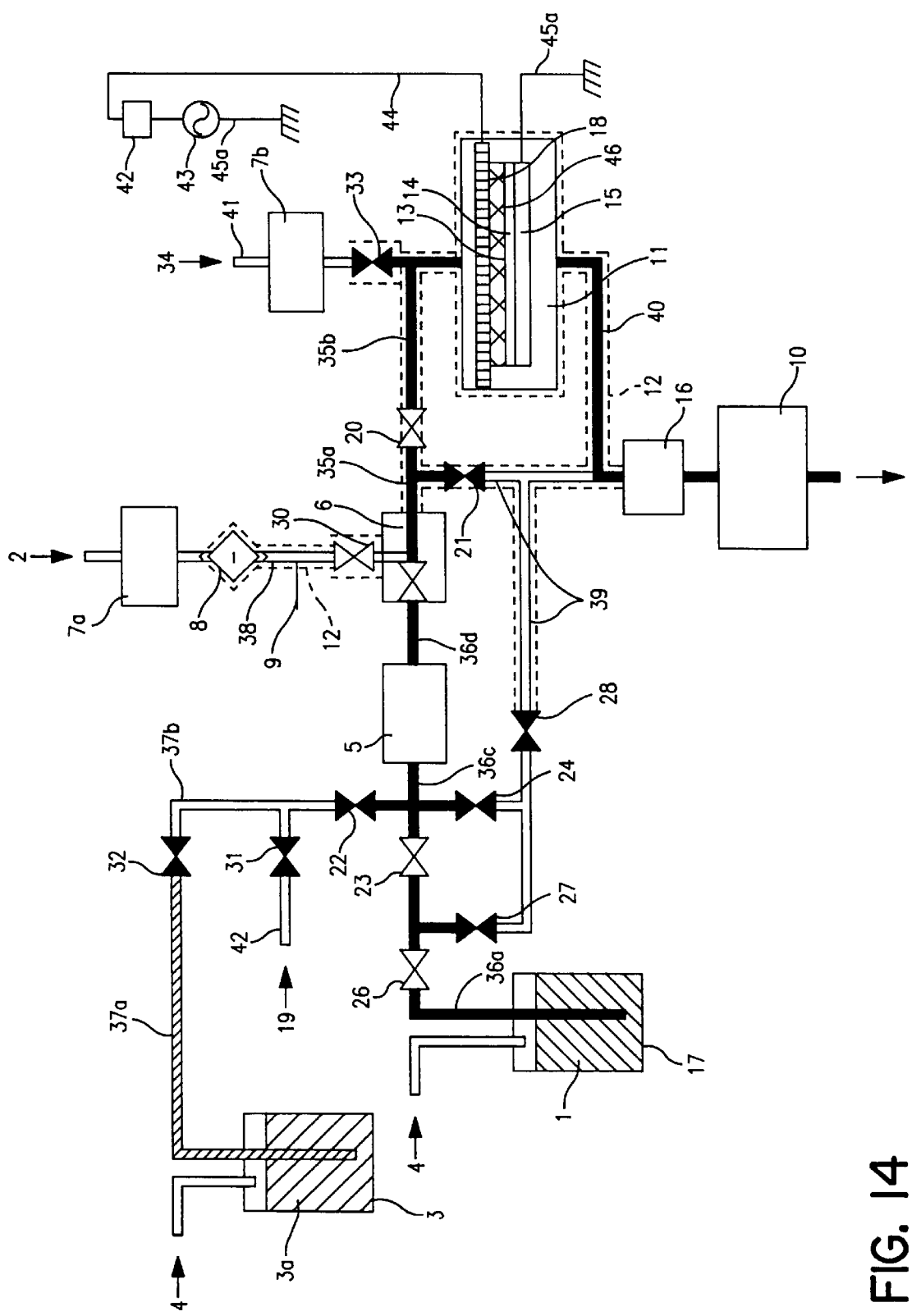
FIG. 14 is a growth flow sheet of a DVS-BCB polymer film using the polymer film growth system of Example 2 according to the present invention.

In Example 2, an attempt was made to reduce the growth temperature of the organic polymer film by introducing the vaporized organic monomer in a plasma gas atmosphere thereby to promote the polymerization reaction of the organic monomer. A configuration of an apparatus, wherein the ring-opening polymerization reaction of the DVS-BCB monomer in the vapor phase is promoted by utilizing a plasma gas, is shown in FIG. 14. In this example, the operation was conducted in the same manner as in Example 1, except that the ring-opening reaction of a carbon four-membered ring in a benzocyclobutene skeleton is initiated at lower temperature by generating plasma, thereby to obtain a polymer film composed of a three-dimensional molecular chain comprising a DVS-BCB monomer as a principal skeleton at lower substrate temperature.

First, the diaphragm valve 6h in the vaporization controller 6 was opened and the DVS-BCB monomer was vaporized. The vaporized DVS-BCB monomer was dispersed by the shower head 18 in the reaction chamber 11, together with the He carrier gas, and then sprayed on the silicon substrate 14 on which a semiconductor integrated circuit is formed. In that case, the substrate heating portion 15 as an electrode is grounded through a ground wire 45b, while the shower head 18 as an electrode is connected with a RF power source 43 and a matching box 42 through a RF cable 44.

RF power was applied to such a shower head 18, thereby to generate plasma 46 between the substrate heating portion 16 and the shower head 18. In this example, RF power was adjusted to 50 W and a frequency of RF power was adjusted to 13.56 MHz. The pressure in the reaction chamber 11 on film-forming was adjusted to 0.77 Torr. The ring-opening reaction of the carbon four-membered ring in the benzocyclobutene skeleton in the vapor phase initiated at the temperature lower than in the case of Example 1 by means of energy of plasma. On the surface of the heated substrate, the polymerization reaction of the ring-opened DVS-BCB monomer occurred thereby to form a DVS-BCB polymer film (organic insulating film) 13. By increasing such power, the reaction is further promoted and the film-forming temperature is also increased. However, when power of not less than 200 W is applied, the composition of the DVS-BCB itself is initiated. Therefore, RF power is preferably within a range from 20 to 190 W. To generate plasma, the pressure of the reaction chamber is preferably within a range from 0.5 to 10 Torr.

The substrate temperature can be reduced by generating plasma and the film can be formed from 100° C. In the case where the adsorption efficiency of the monomer became 25% as a result of promotion of the reaction by generating plasma, it is necessary to supply about 0.15 g of the DVS-BCB monomer so as to grow a DVS-BCB film of 1 μm on the surface of a 8 inch substrate. Accordingly, the DVS-BCB monomer was supplied from the liquid flow indicator 5 at a flow rate of 0.03 g/min for 4 minutes. In this case, unpolymerized DVS-BCB monomer is contained in an exhaust piping 40, but the DVS-BCB monomer was accumulated in a cooling trap cooled to about 20° C. by water cooling and did not penetrate into the exhaust pump 10.

Figure 15:
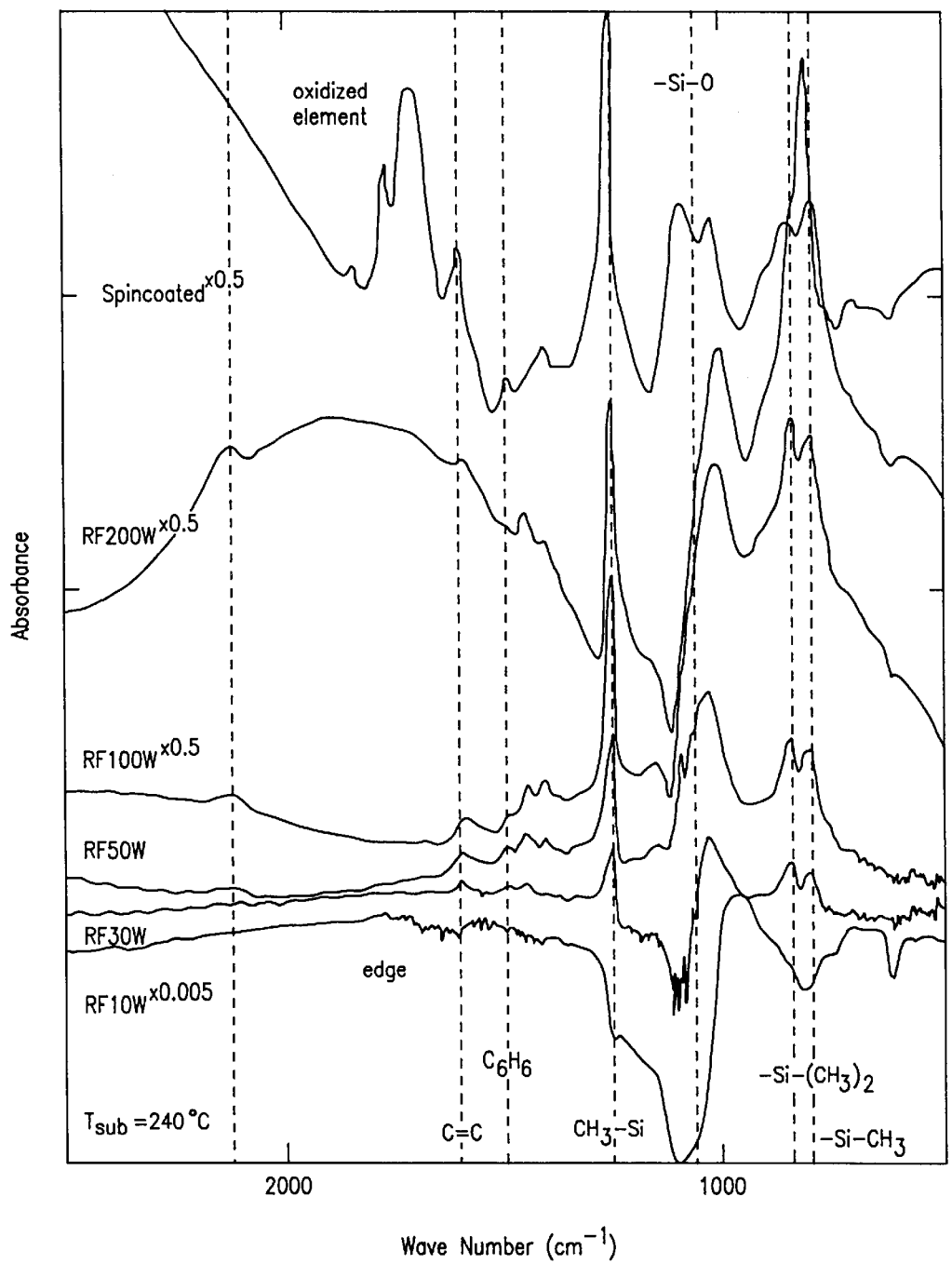
FIG. 15 is an infrared spectrum chart of a DVS-BCB polymer film formed by using the polymer film growth system of Example 2 according to the present invention.

FIG. 15 is an infrared spectrum chart of the DVS-BCB polymer film of the example according to the present invention. In this example, the substrate temperature was adjusted to 240° C. In the drawing, an infrared absorption spectrum of a DVS-BCB polymer film, which is obtained by coating a DVS-BCB monomer dissolved in a solvent using a spincoating method, removing the solvent, baking and polymerizing in an electric furnace under a nitrogen atmosphere at 350° C. for 30 minutes, is also described. In the infrared absorption spectrum of this DVS-BCB polymer film, absorptions corresponding to C=C, $C_6H_4$ (benzene ring), $CH_3Si$—, —SiO—, —$Si(CH_3)_2$— and —$SiCH_3$ were recognized. An increase in infrared absorption at 1700–1900 ($cm^{-1}$, is caused by partial oxidation of DVS-BCB. In the case of the spincoating method, the DVS-BCB monomer film is heated in an electric furnace under a nitrogen atmosphere. That is, it is assumed that contamination with oxygen occurred in the case of putting the substrate in the furnace, thereby to cause partial oxidation of DVS-BCB.

When the substrate heating temperature was 240° C., a specific peak was not recognized in the DVS-BCB polymer film in the case where RF power for generating plasma is 10 W. In the case where RF power is 30 W, 50 W or 100 W, specific peaks corresponding to C=C, $C_6H_4$ (benzene ring), $CH_3Si$—, —SiO—, —$Si(CH_3)_2$— and —$SiCH_3$ were recognized in the DVS-BCB polymer film. In addition, absorption at 1700–1900 ($cm^{-1}$) due to partial oxidation of DVS-BCB was not recognized. This reason is assumed that the MVP method does not include the process of causing contamination with oxygen. The dielectric constant of this DVS-BCB polymer film was from 2.7 to 2.8. On the other hand, when RF power becomes 200 W or higher, absorption at about 1500 ($cm^{-1}$), which corresponds to the benzene ring, becomes very weak. Therefore, it is assumed that partial decomposition reaction of the DVS-BCB skeleton is caused by a plasma gas.

The same results as those described above were recognized up to the substrate heating temperature of 100° C. and effectiveness of the plasma promoting action to reduction in temperature of the polymer film growth by the MVP method was recognized. In such way, the polymerization of the organic monomer in the vapor phase is promoted by He plasma. The plasma gas may be any one, which does not react with the organic monomer, and argon or neon may be used.

What is claimed is:

1. A growth method of a polymer film, which comprises the steps of:

supplying a predetermined amount of a thermally polymerizable organic monomer not having a hydrophilic group in the liquid state, said monomer being a constituent unit for the polymerization reaction formation of said polymer film in a thermally induced polymerization reaction which is other than a condensation polymerization reaction releasing water, to a vaporization controller at a controlled flow rate;

heating the organic monomer in said vaporization controller while supplying a carrier gas, thereby to continuously vaporize the organic monomer while maintaining a partial pressure of the organic monomer lower than a saturated vapor pressure; and transporting the carrier gas containing the vaporized organic monomer to a reaction chamber from the vaporization controller, and spraying the gas on the surface of a substrate arranged in the reaction chamber, thereby to grow a polymer film containing a derivative of the organic monomer in a principal skeleton.

2. The growth method of a polymer film according to claim 1, wherein the organic monomer is vaporized within a temperature range where a polymerization reaction rate of the organic monomer in the vaporization controller is not more than one-hundredth a supply rate of the organic monomer to be supplied to the vaporization controller in the step of continuously vaporizing the organic monomer.

3. The growth method of a polymer film according to claim 1, wherein the temperature of the carrier gas used in the step of supplying the organic monomer to the vaporization controller is the same as or higher than a vaporization temperature of the organic monomer in the vaporization controller.

4. The growth method of a polymer film according to claim 1, wherein an inner wall of a vaporized raw material piping for connecting the vaporization controller with the reaction chamber and an inner wall of the reaction chamber are adjusted to a temperature higher than the vaporization temperature of the organic monomer in the vaporization controller.

5. The growth method of a polymer film according to claim 1, wherein an inner wall of a vaporized raw material piping for connecting the vaporization controller with the reaction chamber and an inner wall of the reaction chamber are adjusted to a temperature higher than the vaporization temperature of the organic monomer in the vaporization controller and, furthermore, the organic monomer contained in the carrier gas is recovered at a front stage of an exhaust pump used for evacuating the vaporization controller, vaporized raw material piping and reaction chamber by using a cooling trap maintained at least at a temperature lower than the vaporization temperature of the organic monomer.

6. The growth method of a polymer film according to claim 1, wherein the organic monomer is divinyl siloxane bisbenzocyclobutene monomer, and a helium gas as the carrier gas is supplied in the vaporization controller at a flow rate of 100 to 300 sccm with maintaining the vaporization controller at not more than 20 Torr and, furthermore, the divinyl siloxane bisbenzocyclobutene monomer is supplied in the vaporization controller at a rate of 0.1 to 0.01 g per minute and heated within a temperature range from 100 to 180° C., thereby to vaporize the divinyl siloxane bisbenzocyclobutene monomer in the step of continuously vaporizing the organic monomer.

7. The growth method of a polymer film according to claim 1, wherein the substrate is a semiconductor substrate.

8. A growth method of a polymer film, which comprises the steps of:

supplying a predetermined amount of a thermally polymerizable organic monomer not having a hydrophilic group in the liquid state, which monomer is a constituent unit for the polymerization reaction formation of said polymer film in a thermally induced polymerization reaction which is other than a condensation polymerization reaction to water, to a vaporization controller at a controlled flow rate;

heating the organic monomer in said vaporization controller while supplying a carrier gas, thereby to continuously vaporize the organic monomer while maintaining a partial pressure of the organic monomer lower than a saturated vapor pressure; and transporting the carrier gas containing the vaporized organic monomer to a reaction chamber from the vaporization controller, introducing the vaporized organic monomer in a plasma gas atmosphere, and spraying the gas on the surface of a substrate arranged in the reaction chamber, thereby to grow a polymer film containing a derivative of the organic monomer in a principal skeleton.

9. The growth method of a polymer film according to claim 8, wherein the organic monomer is vaporized within a temperature range where a polymerization reaction rate of the organic monomer in the vaporization controller is not more than one-hundredth a supply rate of the organic monomer to be supplied to the vaporization controller in the step of continuously vaporizing the organic monomer.

10. The growth method of a polymer film according to claim 8, wherein the temperature of the carrier gas used in the step of supplying the organic monomer to the vaporization controller is the same as or higher than a vaporization temperature of the organic monomer in the vaporization controller.

11. The growth method of a polymer film according to claim 8, wherein an inner wall of a vaporized raw material piping for connecting the vaporization controller with the reaction chamber and an inner wall of the reaction chamber are adjusted to a temperature higher than the vaporization temperature of the organic monomer in the vaporization controller.

12. The growth method of a polymer film according to claim 8, wherein an inner wall of a vaporized raw material piping for connecting the vaporization controller with the reaction chamber and an inner wall of the reaction chamber are adjusted to a temperature higher than the vaporization temperature of the organic monomer in the vaporization controller and, furthermore, the organic monomer contained in the carrier gas is recovered at a front stage of an exhaust pump used for evacuating the vaporization controller, vaporized raw material piping and reaction chamber by using a cooling trap maintained at least at a temperature lower than the vaporization temperature of the organic monomer.

13. The growth method of a polymer film according to claim 8, wherein the organic monomer is divinyl siloxane bisbenzocyclobutene monomer, and a helium gas as the carrier gas is supplied in the vaporization controller at a flow rate of 100 to 3000 sccm with maintaining the vaporization controller at not more than 20 Torr and, furthermore, the divinyl siloxane bisbenzocyclobutene monomer is supplied in the vaporization controller at a rate of 0.1 to 0.01 g per minute and heated within a temperature range from 100 to 180° C., thereby to vaporize the divinyl siloxane bisbenzocyclobutene monomer in the step of continuously vaporizing the organic monomer.

14. The growth method of a polymer film according to claim 8, wherein the substrate is a semiconductor substrate.

* * * * *

UNITED STATES PATENT AND TRADEMARK OFFICE
CERTIFICATE OF CORRECTION

PATENT NO.   : 6,261,974 B1
DATED        : July 17, 2001
INVENTOR(S)  : Kawahara et al.

It is certified that error appears in the above-identified patent and that said Letters Patent is hereby corrected as shown below:

<u>Title page,</u>
Item [73], insert -- and ASM JAPAN K.K." after "Corporation"

<u>Column 16,</u>
Line 21, "300" should be -- 3000 --

Signed and Sealed this

Fourth Day of November, 2003

JAMES E. ROGAN
*Director of the United States Patent and Trademark Office*